United States Patent [19]

Radke

[11] 4,345,165
[45] Aug. 17, 1982

[54] METHODS AND CIRCUITRY FOR VARYING A PULSE OUTPUT OF A RESONANT CIRCUIT

[75] Inventor: Leo L. Radke, Oklahoma City, Okla.

[73] Assignee: Western Electric Company, Inc., New York, N.Y.

[21] Appl. No.: 189,404

[22] Filed: Sep. 22, 1980

[51] Int. Cl.³ .............................................. H03K 5/07
[52] U.S. Cl. .................................. 307/265; 307/268; 328/223; 331/117 R; 331/179
[58] Field of Search ................ 307/265, 268; 328/113, 328/223; 332/9 T, 9 R; 331/117 R, 179

[56] References Cited

U.S. PATENT DOCUMENTS

| | | | |
|---|---|---|---|
| 2,848,613 | 8/1958 | Green et al. .................. | 307/265 X |
| 3,071,676 | 1/1963 | Van Sandwyk ................ | 331/117 |
| 3,297,963 | 1/1967 | Halsted ....................... | 331/117 |
| 3,363,198 | 1/1968 | Davies ........................ | 328/223 |
| 3,609,408 | 9/1971 | Motisher ..................... | 328/113 |

Primary Examiner—John S. Heyman
Attorney, Agent, or Firm—R. P. Miller

[57] ABSTRACT

A pulse generating circuit includes a first trigger circuit including a resistor (43) and transistors (34 and 42) for applying a current pulse to a resonant circuit (capacitor 31–inductor 32) to produce a sinusoidal output pulse having a predetermined width and amplitude, and a second trigger circuit including a resistor (64) and transistors (34 and 67) for applying current to a resonant circuit (capacitors 31 and 33–inductor 32) to produce a sinusoidal output pulse having a second predetermined width. In another embodiment, an inductor (76) contained in a resonant circuit (inductor 76–capacitor 77) is magnetically coupled to the base of a transistor (79) contained in an operate circuit. By selectively connecting various capacitors (99 and 112) and resistors (91 and 114) into the resonant and operate circuits, the overall circuit functions to produce output signals at a first frequency and amplitude and at a second frequency and amplitude or at a third frequency and amplitude when both sets of capacitors and resistors are simultaneously connected.

18 Claims, 5 Drawing Figures

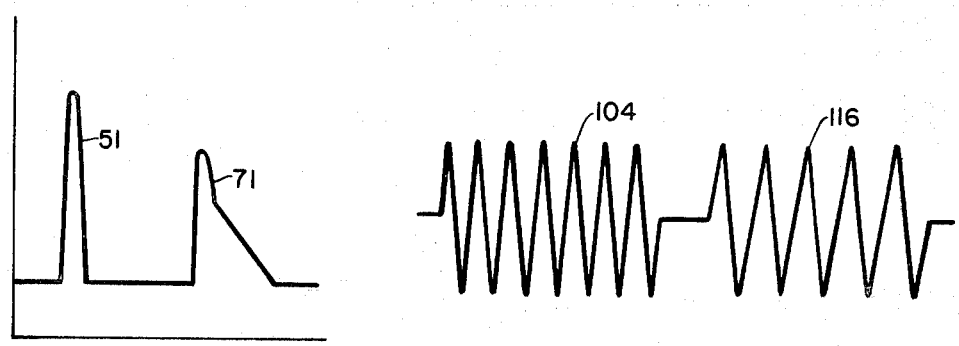
FIG. 3
FIG. 5
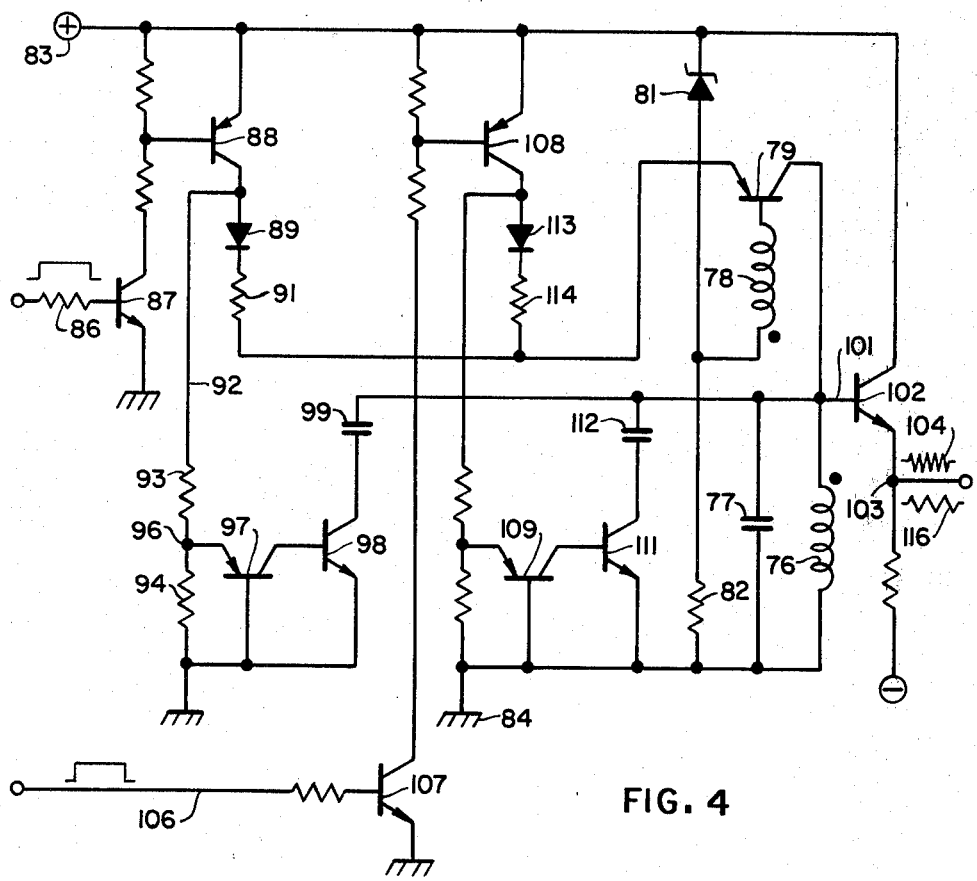
FIG. 4

METHODS AND CIRCUITRY FOR VARYING A PULSE OUTPUT OF A RESONANT CIRCUIT

FIELD OF THE INVENTION

This invention relates to methods and circuitry for varying a pulse output of a resonant circuit and, more particularly, to selectively switching capacitance and/or resistance into and out of an inductance-capacitance network to vary the output width and/or amplitude of either a single pulse or a train of pulses.

BACKGROUND OF THE INVENTION

Circuit designers are always in need for new circuitry for generating pulses of various widths, shapes and amplitudes. It is often desired to provide circuits that produce a first pulse of one duration and amplitude followed by another pulse of a second duration and amplitude or a train of pulses at a first frequency followed by a train of pulses of a second frequency.

One such practical application resides in controlling a telephone switching matrix made up of columns and rows of interconnected coil forms, each of which includes a pair of switching elements in the form of a pair of sealed remanent magnetic reed contacts that are selectively operated by a pair of differentially wound coils. In the normal execution of telephone office switching functions, coil forms in a matrix are selectively operated by concurrent energization of both differential windings of a coil form positioned in a particular row and column. Subsequent switch selection signals are in many cases impressed through both column (vertical) and row (horizontal) windings of already selected (closed) reed contacts such that additional magnetic forces are produced to flex the reed contacts which tend to rub and can ultimately stick together.

In order to alleviate stuck contacts being encountered in a switch select operation, the switch select pulse is preceded by a release pulse which functions to energize the vertical differentially wound coils to positively release the contacts prior to receipt of a select pulse. In order to maximize energy utilization it is desired that the pre-release pulse be of a relatively high amplitude and narrow width with respect to the subsequently applied operate or switch selection pulse. The concept of utilizing pre-release pulses in matrix switch selection sequences is further described in U.S. Pat. No. 3,859,471 issued to Danielsen et al. on Jan. 7, 1975, which discloses separate pulse generating circuits that are sequentially operated to generate a release pulse followed by an operate pulse.

SUMMARY OF THE INVENTION

The present invention contemplates, among other things, a pulse generating circuit including an inductive-capacitance (L-C) controlled resonant circuit wherein the capacitance may be switched to a higher or lower value to control the width of an output pulse or the frequency of a train of output pulses.

More particularly, a first input pulse of a predetermined duration operates a pair of transistors to apply a current pulse to a resonant tank L-C circuit to produce an output sine wave pulse having a duration slightly greater than the duration of the input pulse and an amplitude that is set by a first resistor associated with a second of said transistors. In order to produce an output pulse of greater width and smaller amplitude, an auxiliary circuit is operated to pulse the second triggering transistor through a second resistor having a value different from that of the first resistor. This second input pulse is also utilized to operate a third transistor which is effective to connect an additional capacitor in parallel with the capacitor in the L-C circuit. The L-C circuit now responds to the current pulse from the second transistor to produce an output pulse of longer duration and of a lesser amplitude.

A further modification of the invention contemplates inductively coupling the inductance of the L-C circuit through an inductor connected in the base circuit of the second triggering transistor to provide feedback to sustain oscillation of the circuit during the period of application of the input pulse. The output is a sinusoidal varying wave having a first predetermined frequency. This modification contemplates selectively connecting a second capacitor in parallel with the capacitor in the L-C circuit to change the resonant frequency of the L-C circuit and, hence, the frequency of the output signal. During the selective connection of the second capacitor, a different current setting resistor may also be connected into the circuit to change the amplitude of the output wave.

BRIEF DESCRIPTION OF THE DRAWINGS

Other features and advantages of the invention will be apparent upon consideration of the following detailed description when considered in conjunction with the drawing herein:

FIG. 3 is a wave form diagram illustrating the pulse outputs from the circuit shown in FIG. 2;

FIG. 4 is a schematic circuit diagram of a modified embodiment of the invention wherein pulse trains of different frequencies and amplitudes may be selectively generated, and FIG. 5 is a wave form diagram of the output waves that may be obtained by operation of the circuitry shown in FIG. 4.

DETAILED DESCRIPTION

Figure 1:
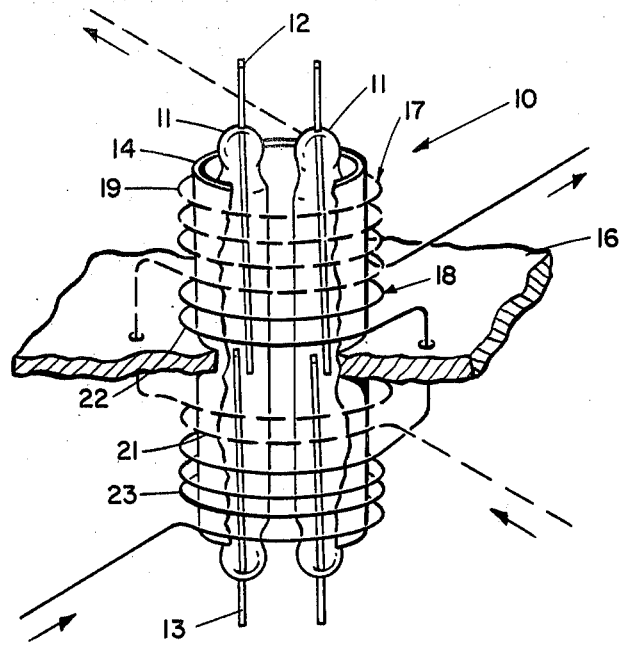
FIG. 1 is a schematic view of a remreed crosspoint switch that may be pulsed by the circuitry of the invention.

Referring to FIG. 1, there is shown a remreed crosspoint switch 10 of the type that is arrayed in columns and rows to form a matrix that is used in an electronic telephone switching system. The crosspoint switch 10 comprises a pair of glass envelopes 11, each of which has mounted therein a pair of remanent magnetic reeds 12 and 13 which are normally spaced apart in an open condition. A plastic sheath 14 is wrapped around the glass envelopes and the assembled switch is fitted within a hole formed in a shunt plate 16.

Each assembled switch includes a pair of differentially wound control windings 17 and 18. The first of the windings 17 (shown in dashed lines) includes a row or a horizontal primary coil 19 with a predetermined number of turns 2N on the upper side of the shunt plate connected in series to a reverse wound secondary coil 21 having N turns. Positioned above the shunt plate is another secondary coil 22 of windings 18 having N turns connected in series with a reverse wound primary coil 23 having 2N turns on the opposite side of the shunt plate. With the differential winding arrangement of the respective coils, a pulsing of either a vertical or horizontal winding results in magnetically polarizing the reeds 12 and 13 to repel each other and thus urge the reeds into an open condition. To operate (select) a crosspoint switch 10, current pulses must be applied simultaneously to both the horizontal and vertical windings 17 and 18. In this situation, the primary windings of the respective coils on the opposite sides of the shunt plate dominate in magnetically polarizing the reeds to be attracted into a closed condition.

In normal operation of a telephone switching network using crosspoint switches, subsequent selection current pulses can be applied through horizontal and vertical windings of already closed crosspoint switches to effectuate re-selection of the already closed crosspoint switches in the matrix. These subsequent current pulses act to flex or rub the reeds causing these reeds, on occasions, to stick together, hence, excluding the use of the open state of these crosspoint switches during subsequent selections. This condition causes improper connections but can be alleviated by preceding each selection current pulse with a release pulse which acts to forcibly open a closed crosspoint switch prior to the simultaneous receipt of the horizontal and vertical winding current select pulses. One such pulsing expedient of this type is disclosed in the afore-identified Danielsen et al. patent.

Figure 2:
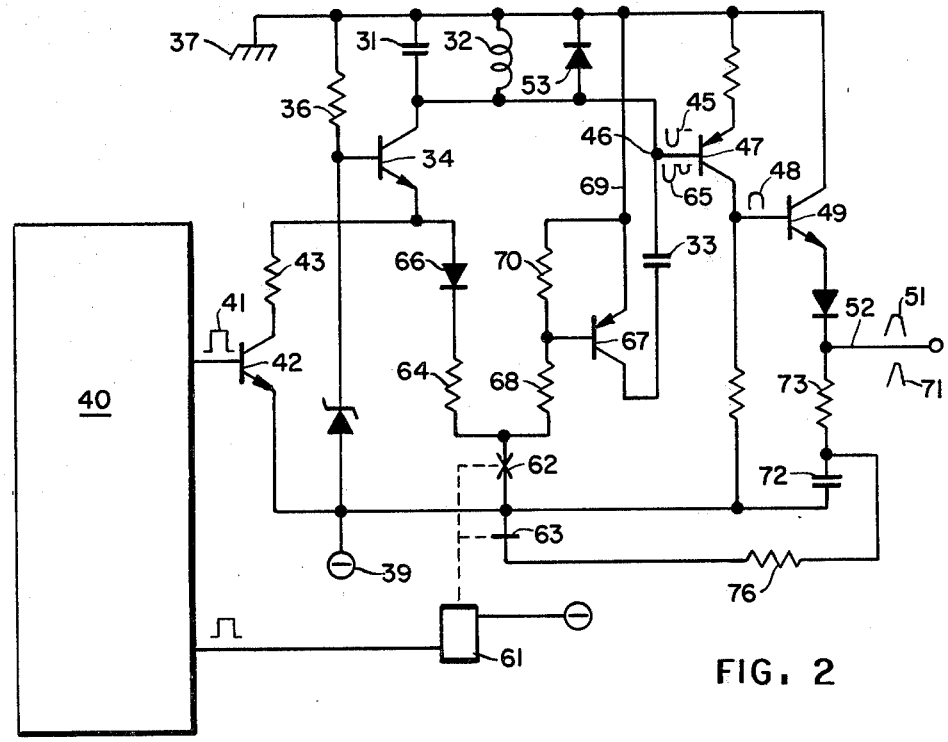
FIG. 2 is a circuit diagram of a control circuit for generating a pair of pulses to operate the switch shown in FIG. 1 and includes facilities for selectively connecting a capacitor and/or a resistor into the circuit to produce pulses of a desired shape, amplitude and duration in accordance with the principles of the present invention.

A first embodiment of the invention is shown in FIG. 2 and is designed to produce a pair of pulses of predetermined shape and amplitude which may be utilized to provide a release current pulse followed by a select current pulse for insuring proper sequential control of a crosspoing switch. It is to be understood, however, that this particular application of the invention is only illustrative, and that the invention finds utility in many other applications where there is a need to provide a single, relatively simple circuit to generate pulses having different durations, shapes and, if required, different amplitudes.

Referring to FIG. 2, there is shown a resonant network or tank circuit comprising a capacitor 31 and an inductance 32 which is to be operated to produce a first sinusoidal pulse of a first predetermined width, and a capacitor 33 which is to be selectively connected into the resonant circuit to produce a second sinusoidal pulse of a greater width. Pulsing energy for the resonant network is supplied through a first triggering circuit which includes an NPN transistor 34. The base of transistor 34 is connected through a biasing resistor 36 to a source of ground potential 37 and the resistor is, in turn, connected through a Zenner diode 38 to a source of negative potential 39. The Zenner diode 38 is maintained in a reverse-bias breakdown condition to establish biasing potential to the base of the transistor 34. In the illustrated embodiment, an initiating pulse 41 is produced in a controller 40 that includes sequencing logic actuated by signal inputs from an electronic telephone switching system common control which, in turn, is controlled by subscriber dialed telephone numbers.

When a telephone number is dialed to select switches of the type shown in FIG. 1 that are contained in matrices of these switches, the controller 40 responds by applying an initiating or input pulse 41 to the base of a transistor 42 having its collector connected through a current setting resistor 43 to the emitter of the transistor 34. The appearance of the pulse 41 on the base of the transistor 42 renders this transistor instantly conductive through the transistor 34 so that transistor 34 is also simultaneously placed in a conductive state. Operation of transistor 34 causes a step function constant current pulse to be applied to the resonant circuit including the inductor 32 and the capacitor 31.

The amplitude of the applied pulse is primarily set by the values of the current setting resistor 43 and the voltage breakdown rating of the Zenner diode 38. The application of the current pulse to the resonant network 31-32 produces a damped sine wave output pulse 45 at a junction 46. The negative portion of the output pulse is impressed on the base of a buffer inverter transistor 47 to produce a positive going sine wave pulse 48 at its collector which is impressed on the base of an emitter-follower transistor 49. Transistor 49 is driven to produce a positive going pulse 51 on an output lead 52 which runs through additional circuitry to a switch of the type shown in FIG. 1. The positive portion or excursion of the sine wave pulse 45 is clamped and dissipated through a diode 53.

The initiating pulse 41 for the resonant network 31-32 is impressed through the resistor 43, hence, the amplitude of the output pulses 45, 48 and 51 are effectively controlled by the value of this resistor. The width of the output pulse 51 is controlled by the values of the capacitor 31 and inductor 32. The initiating pulse 41 is selected to have a width so as to terminate during the last half of the first cycle of the output sine wave pulse 45, thus, only a single positive going pulse output at lead 52 is produced. The output pulse 51 acts to apply a positive releasing force to any contacts in the addressed group of crosspoint switches 10.

The subsequent generation of the operate pulse for the crosspoint switch 10 is then initiated by the controller 40 applying energizing current to a triggering relay 61 which responds by closing contacts 62 and opening contacts 63. Closure of contacts 62 applies negative potential from source 39 through a current setting resistor 64 and a diode 66 to the emitter of the transistor 34. This action drives transistor 34 into a second state of conduction to apply a constant current pulse to the resonant network 31-32 so that a negative going output pulse 65 is again impressed on the base of the buffer inverter transistor 47. However, the width of the negative going portion of this pulse is modified by the action of the capacitor 33 being connected in parallel to the resonant circuit.

More particularly, the closure of the contacts 62 also connects the base of a PNP switching transistor 67 through bias setting resistors 68 and 70 to the source of negative potential 39 to instantly drive the transistor 67 into saturation. The instantaneous saturation of transistor 67 is accompanied by completing a charging circuit for the capacitor 33 which may be traced in a first direction through the saturated transistor 67 and a lead 69 running to the ground source 37, and in a second direction through the operation of transistor 67 in an inverse saturation conduction mode. The capacitor 33 is effectively connected in parallel with the capacitor 31 to increase the total capacitance of the resonant circuit, hence, an output pulse 65 is produced having an increased width. The positive portion of the pulse is again dissipated through the diode 53.

This second output pulse 65, after inversion and passage through the transistors 47 and 49, is identified by the reference numeral 71 and shown in FIG. 3, which also discloses the initial output pulse 51. It will be noted that the output pulse 71 has a delayed trailing section or a wide base. This delay is introduced into the output pulse by a third capacitor 72 in the emitter circuit of the transistor 49. When the relay 61 is operated, a set of contacts 63 open to remove a bypass circuit 76 from the capacitor 72. Inasmuch as the transistor 49 is conducting at this time due to the drive voltage from pulse 65, a charging circuit is completed for the capacitor 72. After the peak of the pulse 65 passes, the conduction of transistor 49 decreases to a point where the base potential approaches the potential on the capacitor 72 at which time transistor 49 becomes non-conducting. The capacitor 72 then functions to discharge through resistor 73 and a load connected to lead 52 to sustain the trailing edge of the pulse impressed on output lead 52. The trailing edge of pulse 71 is extended to provide a smooth slow decay of the select current pulse in the crosspoint switches 10. A secondary benefit of the extension of the trailing edge pulse 71 serves to mask the appearance of a second pulse from the resonant circuit. A second negative peak is observed as a part of the select pulse 65 due to the release time used for controlling the relay 61.

After a suitable time, relay 61 is released and the contact 63 is closed to restore the parallel connection of resistor 76 with the capacitor 72. The values of resistance used for resistor 73 and 76 are such that capacitor 72 does not charge sufficiently to affect the trailing edge of release pulse 51.

Release of the relay 61 also opens the contact 62 thereby removing the voltage 39 from the junction of resistors 64 and 68, thus terminating the select (operate) pulse interval and effectively removing capacitor 33 from the resonant circuit. The action of diode 53 is such that when the select pulse interval is terminated, the polarity of any residual voltage across capacitor 33 will be such that the associated charge will dissipate via the forward bias conduction of the collector-base PN junction of transistor 67 combined with loop discharge elements composed of the resistor 70 and the inductance 32.

In summary, it will be noted that during the generation of the initial output pulse 51, the width of this release current pulse is set by the value of the capacitance 31 combined with its tuning inductance 32 and the amplitude is controlled by the resistor 43. With respect to the generation of the second output pulse 71, the duration of this pulse is set by the value of the parallel connected capacitors 31 and 33. In this instance, the amplitude of the output pulse is controlled by the value of the resistor 64. The resistor 64 in the illustranted embodiment is set to have a value less than the resistor 43, hence, the lower resistance of the reactance charge in the resonant circuit causes the amplitude of the second output pulse to be of a lesser magnitude.

In the illustrated embodiment, the relay 61 is disclosed as the means for initiating the generation of the second output pulse and for connecting the capacitor 33 in parallel with the capacitor 31. In use of the circuit, it may be desired to use all transistor circuitry, in which case the relay contacts 62 and 63 are replaced by a solid state gating arrangement triggered by a pulse similar to the pulse applied to the relay 61.

Referring to FIG. 4 for a consideration of a further embodiment of the invention, there is shown a circuit wherein a capacitor and resistor is switched into and out of a resonant circuit to control the frequency and amplitude of an output signal. More particularly, there is depicted a basic resonant circuit including an inductor 76 and a capacitor 77 similar to the inductor 32 and capacitor 31 shown in FIG. 2. However, in this embodiment the inductor 76 is magnetically coupled to an inductor 78 contained in a base circuit of a transistor 79 so as to provide a positive feed back to sustain an oscillatory output at one of a number of predetermined frequencies. Again, a Zenner diode 81 and a resistor 82 are interconnected between a source of positive potential 83 and a ground return path 84 to provide a bias potential to the base of the transistor 79.

Operation is initiated by impressing a positive potential signal on an input lead 86 to drive a transistor 87 into saturation, whereupon there is a drop in the transistor collector potential which is impressed on the base of a transistor 88. Transistor 88 is driven into saturation to complete a conduction path through a diode 89 and a current setting resistor 91 that is connected to the emitter of the transistor 79 thus driving the transistor 79 into conduction. Transistor 79 is thus enabled to apply a constant current drive to the resonant circuit 76–77.

Simultaneous with the operation of the transistor 88 a circuit is completed from the positive source 83 through the transistor 88, over a lead 92 and through the voltage divider resistors 93 and 94 to the ground return path 84. A juncture 96 between resistors 93 and 94 rises in potential to bias a transistor 97 into saturation. Transistor 97 is functionally connected with a transistor 98 so that both transistors are simultaneously saturated. Operation of transistors 97 and 98 are effective to connect or switch a capacitor 99 in parallel with the capacitor 77. The current provided by the conduction of transistor 79 is thus applied to both the capacitors 77 and 99. The resonant circuit responds to the application of the current by impressing a sinusoidal output on a lead 101 to drive an emitter follower transistor 102 into conduction. Inasmuch as the inductor 76 is coupled to the inductor 78 to provide positive feedback to the base of the transistor, the oscillation of the resonant circuit continues so that a continuing sinusoidal output is impressed on the output lead 101 and an output lead 103 connected to the emitter of the transistor 102.

The frequency of this oscillatory signal is primarily set by the capacitance and inductive values of the resonant circuit. The amplitude of the output wave is primarily determined by the value of the current limiting effects of the current setting resistor 91. The output wave is at a first predetermined frequency and is shown in FIG. 5 and denoted by the reference numeral 104.

A second predetermined frequency may be produced by the circuit when an input pulse is impressed on a lead 106. The appearance of this input pulse biases a transistor 107 into conduction, whereupon a transistor 108 is initiated into conduction. The collector of transistor 108 is connected to bias and operate transistors 109 and 111, whereupon a capacitor 112 is effectively connected or switched in parallel with the capacitor 77. Conduction of transistor 108 applies current through a diode 113 and a current setting resistor 114 to operate the transistor 79 which, in turn, applies operating current to initiate the oscillatory response of the resonant circuit now comprising inductor 76, capacitor 77 and capacitor 112. Assuming that capacitor 112 is higher in capacitance value than capacitor 99, then the output wave will be at a lower frequency. This second lower frequency wave is depicted in FIG. 5 by the reference numeral 116.

The amplitudes of the respective waves may be made different by selecting appropriate values for the current setting resistors 91 and 114. It may be appreciated that both the capacitors 99 and 112 may be selectively connected into the resonant circuit by the simultaneous application of input signals on the input leads 86 and 106 to produce an output signal at yet a third frequency. As an alternative, the capacitor 77 may be removed from the circuit so that in one mode of operation the capacitor 99 will function with the inductor 76 to form a resonant circuit, and in another mode of operation the capacitor 112 will function with the inductor 76 to, in effect, provide a second but different tuned circuit having a second resonant frequency. In this instance, when the input is applied or removed from the input leads 86 or 106, or both, there is an abrupt start or stop of the output signal.

What is claimed is:

1. A pulse pair generating circuit, which comprises:
an inductive-capacitance network for generating a first output pulse of a first predetermined width;
a trigger circuit responsive to an input for applying a current pulse to energize said inductive-capacitance network to generate said first output pulse at a first point in time;
circuit means including a normally unoperated switching transistor and a capacitor connectable across the inductive-capacitance network upon operation of said transistor for controlling said inductive-capacitance network to produce a second output pulse of a second predetermined width; and
means responsive to a second input pulse for operating said switching transistor and said trigger circuit to apply an energizing pulse to said combined inductive-capacitance network and said now connected capacitor to produce an output pulse of said second predetermined width at a second point in time slightly delayed from said first point in time.

2. A pulse generating circuit as defined in claim 1, wherein said trigger circuit includes a pair of transistors and means for biasing the base of a first of said pair of transistors at a preset potential level, and the collector of a second of said pair of transistors is connected through a current limiting resistor to the emitter of the first transistor which functions to control the amplitude of the output pulse.

3. A pulse generating circuit as defined in claim 1, which comprises:
a first resistor connected in said trigger circuit for controlling the amplitude of said first output pulse; and
a second resistor connected to said switching transistor for controlling the amplitude of said second output pulse.

4. A pulse generating circuit as defined in claim 1, wherein said output pulse is a sinusoidal wave and said circuit includes means for clamping and dissipating excursions of said wave in a predetermined direction.

5. A pulse generating circuit, which comprises:
a tank circuit including a first capacitor and an inductor connected in parallel;
a first operating circuit including a first transistor and resistor elements responsive to a first trigger pulse of predetermined duration for operating said first transistor to apply a pulse to said tank circuit to produce an output pulse having a width determined by the value of said first capacitor and an amplitude determined by said first resistor;
a further circuit including a second transistor and a second capacitor connected together in series and connected in parallel to said first capacitor; and
a second operating circuit including said first transistor and a second resistor responsive to a second trigger pulse for operating said second transistor and said first transistor to apply a pulse to said tank circuit to produce an output pulse having a width determined by said first and second capacitors and an amplitude determined by said second resistor.

6. A pulse generating circuit, which comprises:
a first network having a first capacitor and inductor connected in parallel;
a pair of triggering transistors having a collector of a first transistor connected to a first side of said network, and the emitter of said first transistor connected to the collector of the second transistor;
means for applying biasing potential to the base of the first transistor, to the emitter of the second transistor and through the network to the collector of the first transistor;
means for applying a pulse to the base of the second transistor to operate said second and first transistors to apply a current pulse to said first network to produce a first output sine wave having a pulse width determined by the value of said first capacitor;
a second capacitor;
means including a normally unoperated third transistor for connecting said second capacitor in parallel with said first capacitor; and
selectively operable means interposed between said biasing means and said first transistor and said third transistor for operating said third transistor to connect said second capacitor in parallel with the first capacitor and for operating said first transistor to apply a current pulse to said network and said parallel connected second capacitor to produce an output sine wave having a pulse width greater than the pulse width of said first output sine wave.

7. A pulse generating circuit, which comprises:
an inductor and a first capacitor connected in parallel to form a first resonant network;
a first transistor connected to apply an energizing current pulse to said first resonant network;
a first operating circuit including a second transistor connected through a first resistor to said first transistor;
first input means responsive to a first input signal for applying said signal to said first operating circuit to operate said first and second transistors to apply energizing current to said first resonant circuit to generate a first output signal at a first frequency;
a second operating circuit including normally unoperated circuit making means connected through a second resistor to said first transistor;
a normally unoperated third transistor and a serially connected second capacitor connected in parallel with said first capacitor; and
a second input means responsive to a second input signal for operating said third transistor to connect the second capacitor in parallel with the first capacitor and for operating said circuit making means to operate the first transistor to apply an energizing current to said first resonant circuit and the now parallel connected second capacitor to generate a second output signal at a second frequency.

8. A pulse generating circuit as defined in claim 7, wherein said first and second resistors are of different values to produce output signals of different amplitudes.

9. A pulse generating circuit as defined in claim 7, which includes:
means for inductively coupling said inductor to the base of the first transistor to sustain the output signals so long as said first or second input signal is impressed on said first or second operating circuit.

10. A frequency pulse generating circuit, which comprises:
an inductance;
a first capacitance;
means for connecting said first capacitance in parallel with said inductance to provide a first resonant circuit;
a transistor having an output connected to said resonant circuit;
means responsive to a first input pulse for operating said transistor to apply a sustained current pulse to said resonant circuit to produce an output signal of a first frequency;
a second capacitor;
means for selectably connecting the second capacitor in parallel with said inductor to provide a second resonant circuit; and
means responsive to a second input signal for operating said selectably connecting means to connect said second capacitor in parallel with said inductance and for operating said transistor to apply a current pulse to said second resonant circuit to produce an output signal at a second frequency.

11. A frequency pulse generating circuit as defined in claim 10, which includes:
means for inductively coupling the base of said transistor to said inductance.

12. A method of generating pulses having different widths, which comprises:
applying a first input pulse through a first transistor to apply a current pulse to a network including an inductance and a first capacitance connected parallel to produce a first output pulse of a first predetermined duration; and
applying a second input pulse through a second transistor to connect a second capacitance in parallel with the first inductance while said second input pulse is also applied through the first transistor to apply a current pulse to the network to produce a second output pulse of a second predetermined duration.

13. A method of generating pulses having different widths, as set forth in claim 12, which comprises:
applying the first input pulse through a first resistor which determines the amplitude of the first output pulse; and
applying the second input pulse to a second resistor which determines the amplitude of the second output pulse.

14. A method of generating pulses of two different widths, which comprises:

applying a first input pulse of finite duration to operate a first trigger circuit to produce a current pulse;
applying said current pulse to an inductive-capacitance network having a response characteristic to produce a first sinusoidal output wave having one positive going pulse and one negative going pulse, the total duration of which is greater than the duration of said input pulse; and
applying a second input pulse to operate a transistor to connect a capacitor across said inductive-capacitance network while said second input pulse operates said first trigger circuit to apply a current pulse to said network and the connected capacitor to produce a second sinusoidal output wave having one positive going pulse and one negative pulse the total duration of which is greater than the duration of said first output wave.

15. A method of generating pulses of two different widths as set forth in claim 14, which comprises:
means for clamping and dissipating the positive going pulses.

16. A method of generating sine wave pulses having different individual pulse widths, which comprises:
applying a first input pulse of a first predetermined width through a first transistor to a network having a first capacitor and an inductance to generate a first sine wave output pulse having a width greater than the width of the input pulse; and
applying a second input pulse of a second predetermined width to said first transistor to apply energy to said network while said second pulse is applied to operate a second transistor to connect a second capacitor in parallel with said first capacitor to generate a second sine wave output pulse having a width greater than the first sine wave output pulse.

17. A method as set forth in claim 16, wherein:
said applied first input pulse is directed through a first resistor to operate the first transistor and set the amplitude of the first sine wave output pulse at a first magnitude; and
said applied second input pulse is directed through a second resistor to operate the first transistor and set the amplitude of the second sine wave output pulse at a second magnitude which differs from the magnitude of the first sine wave output pulse by a difference that varies in accordance with the difference in value in said first and second resistors.

18. A method of generating signals having different frequencies, which comprises:
applying a first driving signal to operate a first transistor to impress current to a network having an inductance and capacitor connected in parallel;
inductively coupling the inductance of said network to said first transistor to produce a network output signal at a first frequency; and
applying a second driving signal to operate said first transistor while said second driving signal is applied to operate a second transistor to connect a second capacitor in parallel with said first capacitor to produce a network output signal having a second frequency which is less than said first frequency.

* * * * *